(12) United States Patent
Liu

(10) Patent No.: US 10,527,878 B2
(45) Date of Patent: Jan. 7, 2020

(54) DISPLAY PANEL AND METHOD FOR MANUFACTURING THE SAME

(71) Applicant: INT TECH CO., LTD., Hsinchu County (TW)

(72) Inventor: Yu-Chen Liu, Hsinchu County (TW)

(73) Assignee: INT TECH CO., LTD., Hsinchu County (TW)

( * ) Notice: Subject to any disclaimer, the term of this patent is extended or adjusted under 35 U.S.C. 154(b) by 38 days.

(21) Appl. No.: 15/703,469

(22) Filed: Sep. 13, 2017

(65) Prior Publication Data

US 2019/0079338 A1 Mar. 14, 2019

(51) Int. Cl.
*G02F 1/1335* (2006.01)
*G02F 1/00* (2006.01)
(Continued)

(52) U.S. Cl.
CPC ........ *G02F 1/133502* (2013.01); *G02B 1/111* (2013.01); *G02B 5/3075* (2013.01);
(Continued)

(58) Field of Classification Search
CPC .................................................. G02F 1/1335
See application file for complete search history.

(56) References Cited

U.S. PATENT DOCUMENTS

2008/0079866 A1* 4/2008 Mimura ............ G02F 1/133524
349/61
2009/0073535 A1* 3/2009 Sekine ................. G02B 5/3008
359/240

(Continued)

FOREIGN PATENT DOCUMENTS

JP 2006-256310 A 9/2006
JP 2015-200866 A 11/2015
TW 200521568 A 7/2005

OTHER PUBLICATIONS

Office Action and Search Report dated Jul. 4, 2018 issued by the Taiwan Intellectual Property Office (TIPO) for counterpart application No. 106139713.

(Continued)

*Primary Examiner* — Sang V Nguyen
(74) *Attorney, Agent, or Firm* — WPAT, P.C., Intellectual Property Attorneys; Anthony King

(57) ABSTRACT

A display panel includes a display device, an optical absorbing layer, an anti-reflection structure and a cover layer. The display device includes a plurality of pixels. The optical absorbing layer is over the display device and configured to absorb a light within a wavelength range. The anti-reflection structure is over the pixels of the display device, wherein the anti-reflection structure includes a photo-sensitive alignment layer, a liquid crystal circular polarizer and a linear polarizer. The photo-sensitive alignment layer is over the optical absorbing layer, wherein the photo-sensitive alignment layer is sensitive to and curable by the light within the wavelength range. The liquid crystal circular polarizer is over the photo-sensitive alignment layer, wherein the liquid crystal circular polarizer includes a plurality of liquid crystal molecules aligned by the photo-sensitive alignment layer. The linear polarizer is over the liquid crystal circular polarizer. The cover layer is over the anti-reflection structure.

15 Claims, 16 Drawing Sheets

(51) Int. Cl.
*G02F 1/01* (2006.01)
*G02B 5/30* (2006.01)
*H01L 51/52* (2006.01)
*G02B 1/111* (2015.01)
*G02F 1/1337* (2006.01)

(52) U.S. Cl.
CPC .......... *G02F 1/0063* (2013.01); *G02F 1/0136* (2013.01); *G02F 1/1337* (2013.01); *H01L 51/5203* (2013.01); *H01L 51/5281* (2013.01)

(56) References Cited

U.S. PATENT DOCUMENTS

| | | | | |
|---|---|---|---|---|
| 2012/0088037 A1* | 4/2012 | Oki | ................ | G02B 5/208 427/553 |
| 2014/0070189 A1* | 3/2014 | Leem | ................ | H01L 51/5203 257/40 |
| 2015/0064367 A1* | 3/2015 | Choi | ................ | G02F 1/133502 428/1.31 |
| 2015/0109561 A1* | 4/2015 | Fuchida | ................ | G02B 1/105 349/96 |
| 2015/0116834 A1* | 4/2015 | Osumi | ................ | G02B 1/118 359/601 |
| 2015/0277012 A1* | 10/2015 | Nakamura | ............. | G02B 5/045 349/96 |
| 2015/0311477 A1* | 10/2015 | Cho | ................ | H01L 51/5284 257/40 |
| 2016/0104869 A1* | 4/2016 | Choi | ................ | H01L 51/5281 257/40 |
| 2016/0245956 A1* | 8/2016 | Kodama | ................ | C09D 4/00 |
| 2017/0271420 A1* | 9/2017 | Tsai | ................ | H01L 27/32 |
| 2017/0294628 A1* | 10/2017 | Kim | ................ | H01L 51/5253 |
| 2017/0322358 A1* | 11/2017 | Ueki | ................ | B32B 7/02 |
| 2017/0336546 A1* | 11/2017 | Ohyama | ............. | G02B 5/3016 |

OTHER PUBLICATIONS

English Abstract Translation of JP2006256310A.
English Abstract Translation of TW106139713 (Office Action and Search Report Summary).

* cited by examiner

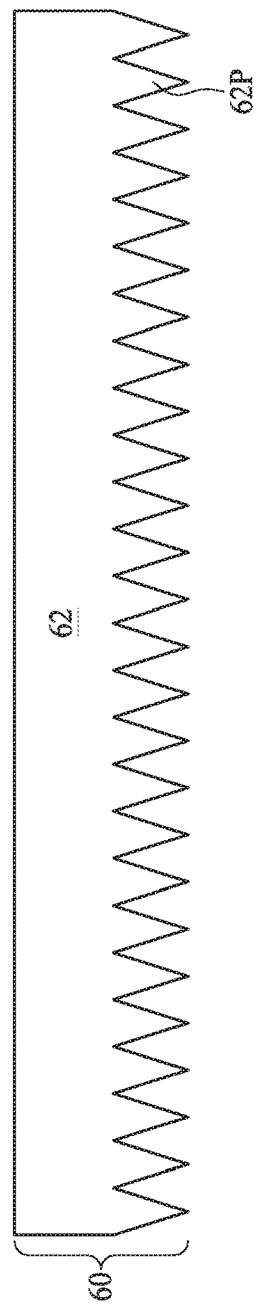

DISPLAY PANEL AND METHOD FOR MANUFACTURING THE SAME

BACKGROUND

A display panel such as an organic light-emitting diode (OLED) display panel has been incorporated in various electronic devices such as smart phones to provide display function. The display panel, however, suffers from ambient light reflection in outdoor use, which deteriorates visibility of the display panel.

SUMMARY

Embodiments of the present disclosure provide a display panel including a display device, an optical absorbing layer, an anti-reflection structure and a cover layer. The display device includes a plurality of pixels. The optical absorbing layer is over the display device and configured to absorb a light within a wavelength range. The anti-reflection structure is over the pixels of the display device, wherein the anti-reflection structure includes a photo-sensitive alignment layer, a liquid crystal circular polarizer and a linear polarizer. The photo-sensitive alignment layer is over the optical absorbing layer, wherein the photo-sensitive alignment layer is sensitive to and curable by the light within the wavelength range. The liquid crystal circular polarizer is over the photo-sensitive alignment layer, wherein the liquid crystal circular polarizer includes a plurality of liquid crystal molecules aligned by the photo-sensitive alignment layer. The linear polarizer is over the liquid crystal circular polarizer. The cover layer is over the anti-reflection structure.

In some embodiments, the optical absorbing layer is configured to absorb an invisible light.

In some embodiments, the optical absorbing layer comprises a UV light absorbing layer, and the wavelength range is substantially between 200 nm and 400 nm.

In some embodiments, the liquid crystal circular polarizer is configured as a ¼ wavelength retardation layer.

In some embodiments, the display device includes an organic light-emitting diode (OLED) device, and each of the pixels includes an anode, an organic light-emitting layer over the anode, and a cathode over the organic light-emitting layer.

In some embodiments, the photo-sensitive alignment layer has a curing temperature lower than a glass transition temperature of the organic-light emitting layer.

In some embodiments, the display panel further includes a thin film encapsulation between the display device and the optical absorbing layer.

In some embodiments, the display panel further includes a touch input device between the display device and the cover layer.

In some embodiments, the display panel further includes at least one anti-reflection layer between the display device and the cover layer.

In some embodiments, the anti-reflection layer is between the linear polarizer and the cover layer.

In some embodiments, the anti-reflection layer is between the optical absorbing layer and the display device.

In some embodiments, the anti-reflection layer comprises a structural layer including a plurality of protrusion structures opposite to the linear polarizer.

In some embodiments, the anti-reflection layer further comprises an optical layer in contact with the structural layer, and a surface of the optical layer is engaged with the protrusion structures.

In some embodiments, a refractive index of the optical layer is smaller than a refractive index of the structural layer.

Embodiments of the present disclosure provide a display penal including an organic light-emitting diode (OLED) device and an anti-reflection structure. The OLED device includes a plurality of pixels, wherein each of the pixels includes an anode, an organic light-emitting layer over the anode, and a cathode over the organic light-emitting layer. The organic light-emitting layer has a glass transition temperature. The anti-reflection structure is over the pixels of the OLED device, wherein the anti-reflection structure includes a photo-sensitive alignment layer, a liquid crystal circular polarizer, and a linear polarizer. The photo-sensitive alignment layer is over the OLED device, wherein the photo-sensitive alignment layer has a curing temperature lower than the glass transition temperature of the organic-light emitting layer. The liquid crystal circular polarizer is over the photo-sensitive alignment layer, wherein the liquid crystal circular polarizer includes a plurality of liquid crystal molecules aligned by the photo-sensitive alignment layer and configured as a wavelength retardation layer. The linear polarizer is over the liquid crystal circular polarizer.

In some embodiments, the display panel further includes an optical absorbing layer over the OLED device.

Embodiments of the present disclosure provide a method for manufacturing a display panel. The method includes forming an organic light-emitting diode (OLED) device comprising an organic light-emitting layer, wherein the organic light-emitting layer has a glass transition temperature; forming a photo-sensitive material over the OLED device; and heating the photo-sensitive material at a curing temperature, wherein the curing temperature of the photo-sensitive material is lower than the glass transition temperature of the organic light-emitting layer. The method further includes irradiating the photo-sensitive material with a light to form a photo-sensitive alignment layer; forming a plurality of liquid crystal molecules over the photo-sensitive alignment layer, the liquid crystal molecules being aligned by the photo-sensitive alignment layer to form a liquid crystal circular polarizer; and forming a linear polarizer over the liquid crystal circular polarizer.

In some embodiments, the method further includes forming an optical absorbing layer over the OLED device prior to the forming the photo-sensitive material over the display device.

In some embodiments, the light is a linear polarizing invisible light.

In some embodiments, the linear polarizing invisible light is a linear polarizing UV light having a wavelength range substantially between 200 nm and 400 nm.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7A is a schematic diagram of an anti-reflection layer in accordance with some embodiments of the present disclosure.

DETAILED DESCRIPTION

Figure 1:
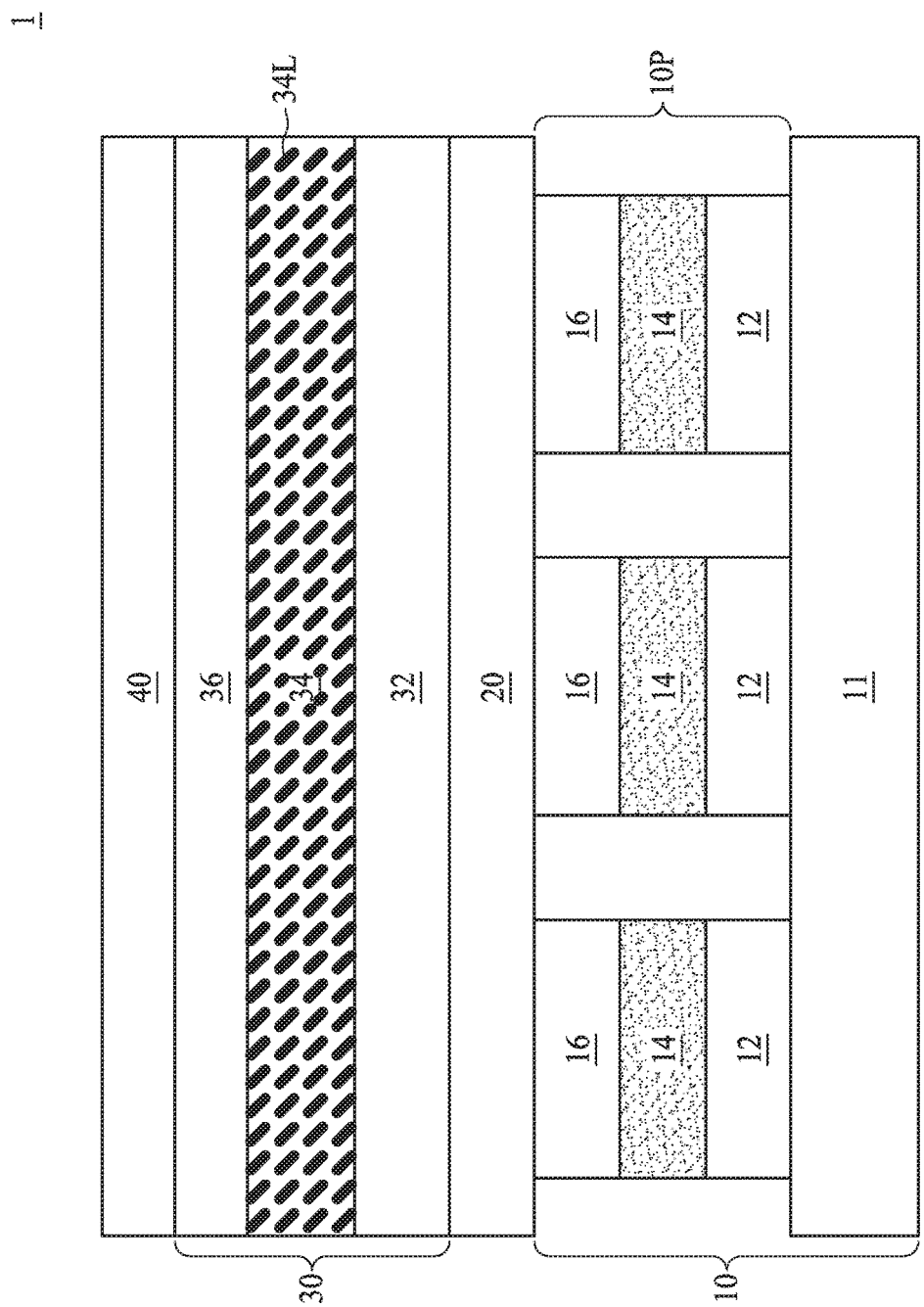
FIG. 1 is a schematic diagram of a display panel in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

Further, spatially relative terms, such as "beneath," "below," "lower," "above," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

In some embodiments of the present disclosure, a display panel such as an OLED display panel including an integrally-formed anti-reflection structure is provided. The integrally-formed anti-reflection structure can be directly formed on the display surface of the display panel without damaging the display device such as OLED device and without requiring additional adhesive layers, and thus can save manufacturing costs, minimize the overall thickness of the display panel and increase adhesion. The integrally-formed anti-reflection structure can inhibit reflection of incident light from the environment, and thus can increase visibility and contrast ratio in outdoor use.

FIG. 1 is a schematic diagram of a display panel in accordance with some embodiments of the present disclosure. As shown in FIG. 1, the display panel 1 includes a display device 10, an anti-reflection structure 30 and a cover layer 40. In some embodiments, the display panel 1 may include an electroluminescent display panel such as an OLED display panel. In some embodiments, the display device 10 may include a plurality of pixels 10 P formed over a substrate 11. The substrate 11 may include a rigid substrate such as a glass substrate, or a flexible substrate such as a plastic substrate. In some embodiments, circuitries such as driving circuits may be formed on the substrate 10. Each of the pixels 10P may include an anode 12, an organic light-emitting layer 14 and a cathode 16. The anode 12 may be formed over the substrate 11, and electrically connected to the driving circuits. The organic light-emitting layer 14 may be formed over the anode 12. The cathode 16 may be formed over the organic light-emitting layer 14, and electrically connected to the driving circuits. In some embodiments, the anodes 12, the organic light-emitting layers 14 and the cathodes 16 may be formed on the substrate 11 by deposition, photolithography and etching techniques, and thus the resolution of the display device 10 can be increased. The anode 12 and the cathode 16 may be formed from transparent conductive material such as indium tin oxide (ITO) or metal material with thin thickness. In some embodiments, the display device 10 may include a flexible display device or a bendable display panel. In such a case, the anode 12 and the cathode 16 may be formed from conductive material with good ductility and malleability such as thin metal.

The anti-reflection structure 30 is disposed over the pixels 10P of the display device 10, and configured to inhibit reflection of incident ambient light and to pass the lights emitted from the pixels 10P, so that the contrast ratio of the display panel 1 in outdoor environment is improved. In some embodiments, the anti-reflection structure 30 may be integrally formed over the display device 10 without requiring additional adhesive layer. In some embodiments, the anti-reflection structure 30 may include a photo-sensitive alignment layer 32, a liquid crystal circular polarizer 34 and a linear polarizer 36. In some embodiments, the photo-sensitive alignment layer 32 is disposed over the display device 10. In some embodiments, the photo-sensitive alignment layer 32 may be formed from a photo-sensitive material such as a polyimide-based material. The photo-sensitive alignment layer 32 is sensitive to and curable by a light within a wavelength range. In some embodiments, the photo-sensitive alignment layer 32 is sensitive to an invisible light such as a UV light, and the light is within the wavelength range between 200 nm and 400 nm, but not limited thereto. In some embodiments, the photo-sensitive material may be thermally cured to be solidified at a curing temperature. In some embodiments, the curing temperature of the photo-sensitive material is lower than the glass transition temperature of the organic light-emitting layers 14 such that the organic light-emitting layers 14 is not damaged. For example, the curing temperature of the photo-sensitive alignment layer 32 is substantially lower than 110° C., such as between about 50° C. and about 80° C., but not limited thereto.

In some embodiments, the display panel 1 may optionally include an optical absorbing layer 20 disposed over the display device 10 and configured to absorb the light for curing the photo-sensitive alignment layer 32. The optical absorbing layer 20 may be integrally formed over the display panel 1. The installation of the optical absorbing layer 20 may prevent the display device 10, particularly the organic light-emitting layers 14, from being damaged by exposure to the light for curing the photo-sensitive alignment layer 32. In some embodiments, the optical absorbing layer 20 is configured to absorb an invisible light. By way of example, the optical absorbing layer includes a UV light absorbing layer, and the wavelength range is substantially between 200 nm and 400 nm.

The liquid crystal circular polarizer 34 is disposed over the photo-sensitive alignment layer 32. The liquid crystal circular polarizer 34 includes a plurality of liquid crystal molecules 34L aligned by the photo-sensitive alignment layer 32. In some embodiments, the material of the photo-sensitive alignment layer 32 may be decomposed by optical irradiation, and the decomposed material may be bonded to liquid crystal molecules 34L so as to align the liquid crystal molecules 34L. The aligned liquid crystal molecules 34L therefore can provide phase retardation effect. In some embodiments, the liquid crystal circular polarizer 34 is configured as a ¼ wavelength retardation layer. In some embodiments, the liquid crystal molecules 34L may include smectic liquid crystal molecules, nematic liquid crystal molecules, cholesteric liquid crystal molecules, disk-like liquid crystal molecules, rod-like liquid crystal molecules, or other suitable liquid crystal molecules.

The linear polarizer 36 is disposed over the liquid crystal circular polarizer 34. In some embodiments, the linear polarizer 36 may be in contact with the liquid crystal circular polarizer 34, and may be integrally formed over the liquid crystal circular polarizer 34. The linear polarizer 36 is configured to let a light of a specific linear polarization pass and filter a light of another specific linear polarization. The linear polarizer 36 in conjunction with the liquid crystal circular polarizer 34 is configured as the anti-reflection structure 30 to inhibit incident ambient light.

In some embodiments, the cover layer 40 is disposed over the anti-reflection structure 30. The cover layer 40 is configured as a protection layer to protect the display panel 1. In some embodiments, the cover layer 40 may include a plastic layer, but is not limited thereto.

In some embodiments, other functional layer(s) configured to provide other functions may be integrally formed over the display device 10.

Figure 2:
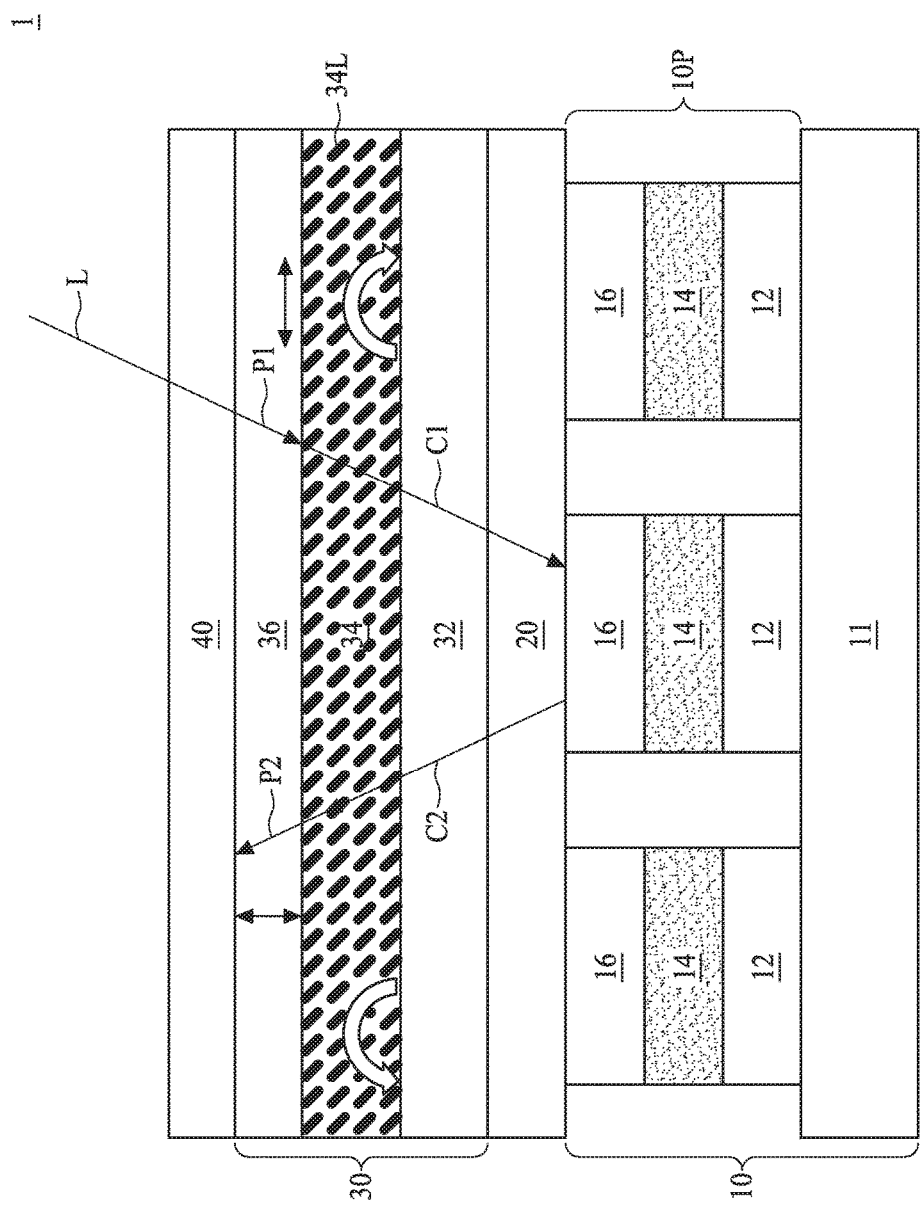
FIG. 2 is a schematic diagram illustrating a light path of an incident ambient light of a display panel in accordance with some embodiments of the present disclosure.

FIG. 2 is a schematic diagram illustrating a light path of an incident ambient light of a display panel in accordance with some embodiments of the present disclosure. As illustrated in FIG. 2, a portion of an incident ambient light L passes through the linear polarizer 36, and becomes a first linear polarizing light P1 such as a horizontal polarizing light. The first linear polarizing light P1 then passes through the liquid crystal circular polarizer 34, and is retarded by ¼ wavelength to become a first circular polarizing light C1 such as right circular polarizing light. The first circular polarizing light C1 is then reflected by the cathodes 16 or the anodes 12 of the display device 10, and the polarization of the first circular polarizing light C1 is inversed to become a second circular polarizing light C2 such as a left circular polarizing light. The second circular polarizing light C2 then passes through the liquid crystal circular polarizer 34, and is retarded by ¼ wavelength to become a second linear polarizing light P2 such as a vertical polarizing light. The second linear polarizing light P2 is filtered by the linear polarizer 36, and thus will not exit. Accordingly, reflection of the incident ambient light L is inhibited.

The display panel of the present disclosure is not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 3:
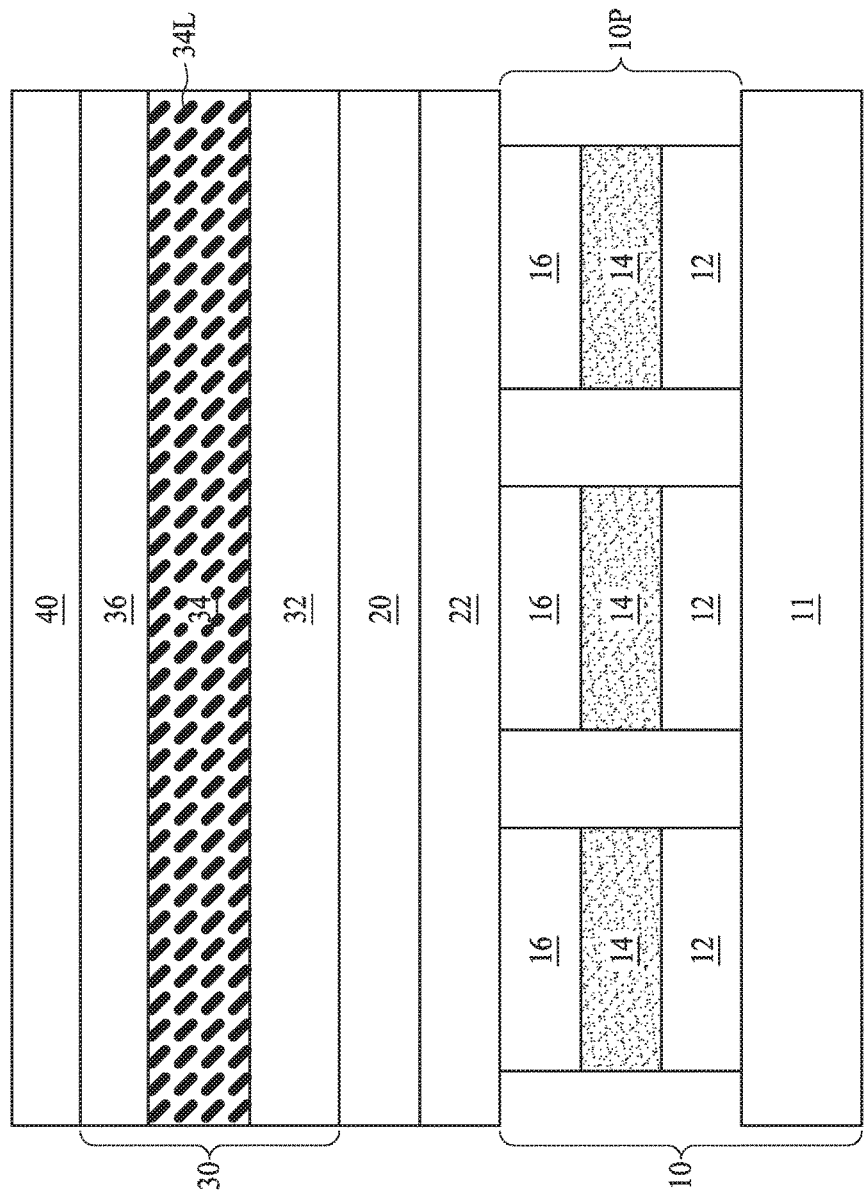
FIG. 3 is a schematic diagram of a display panel in accordance with some embodiments of the present disclosure.

FIG. 3 is a schematic diagram of a display panel in accordance with some embodiments of the present disclosure. As shown in FIG. 3, in contrast to the display panel 1 of FIG. 1, the display panel 2 may further include a thin film encapsulation (TFE) 22 disposed between the display device 10 and the anti-reflection structure 30 such as between the display device 10 and the optical absorbing layer 20. The TFE 22 is configured to encapsulate the display device 10 from being exposed to moisture, oxygen or the like, such that the lifetime of the display panel 2 can be extended. In some embodiments, the TFE 22 may be integrally formed over the display device 10. In some embodiments, the TFE 22 may be a single-layered encapsulation formed from organic material or inorganic material. In some embodiments, the TFE 22 may be a multi-layered encapsulation formed from organic material and inorganic material stacked to one another. For example, the TFE 22 may include two inorganic films and one organic film sandwiched between those two inorganic films.

Figure 4:
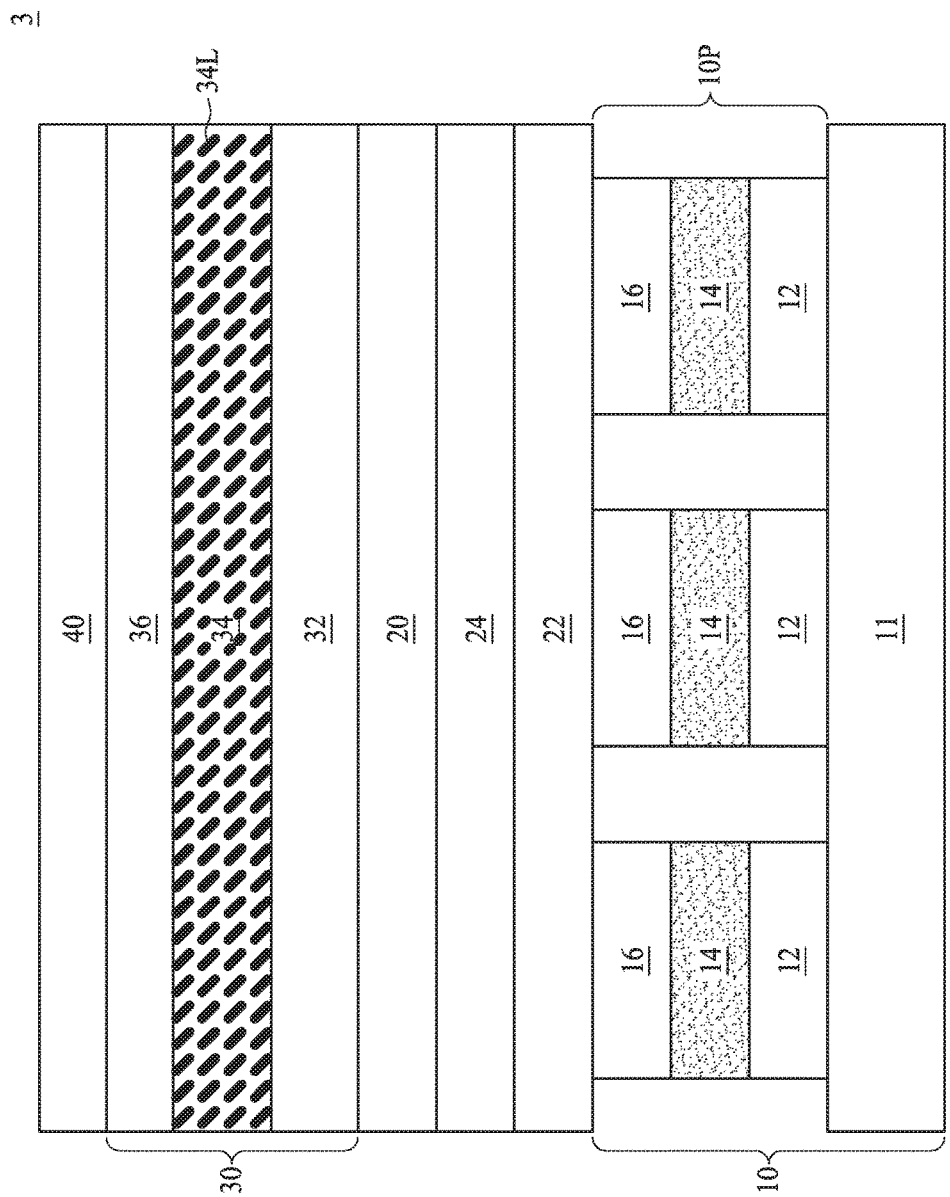
FIG. 4 is a schematic diagram of a display panel in accordance with some embodiments of the present disclosure.

FIG. 4 is a schematic diagram of a display panel in accordance with some embodiments of the present disclosure. As shown in FIG. 4, in contrast to the display panel 2 of FIG. 3, the display panel 3 may further include a touch input device 24 configured to provide touch input function. In some embodiments, the touch input device 24 may be disposed between the display device 10 and the cover layer 40. In some embodiments, the touch input device 24 may be disposed between the TFE 22 and the anti-reflection structure 30, but is not limited thereto. In some embodiments, the touch input device 24 may be integrally formed over the TFE 22. In some embodiments, the touch input device 24 may include a capacitive touch input device or other types of touch input device.

Figure 5:
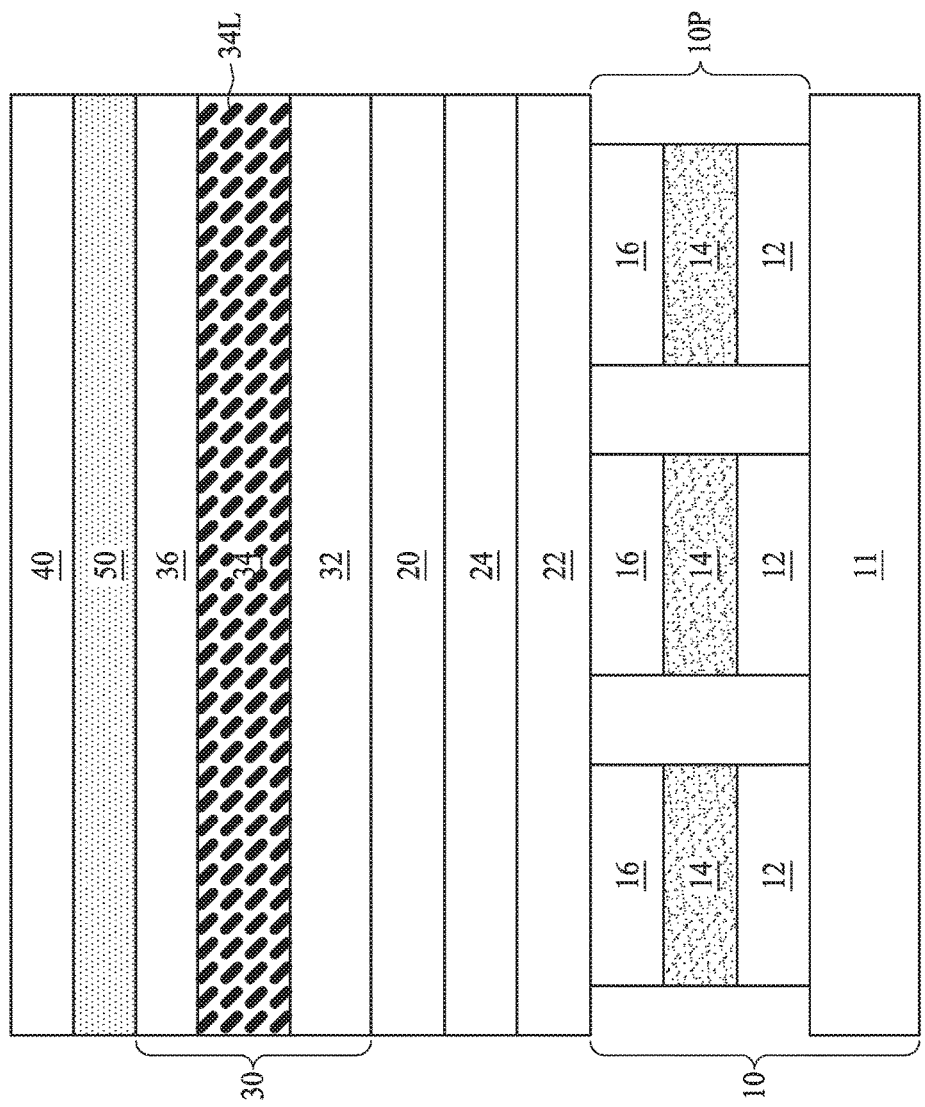
FIG. 5 is a schematic diagram of a display panel in accordance with some embodiments of the present disclosure.

FIG. 5 is a schematic diagram of a display panel in accordance with some embodiments of the present disclosure. As shown in FIG. 5, in contrast to the display panel 3 of FIG. 4, the display panel 4 may further include at least one anti-reflection layer 50 between the display device 10 and the cover layer 40. In some embodiments, the first anti-reflection layer 50 may be disposed between the linear polarizer 36 and the cover layer 40. In some embodiments, the anti-reflection layer 50 may be integrally formed over the anti-reflection structure 30. In some embodiments, the detailed structure of the anti-reflection layer 50 may be illustrated in FIG. 5A or FIG. 5B.

Figure 5A:
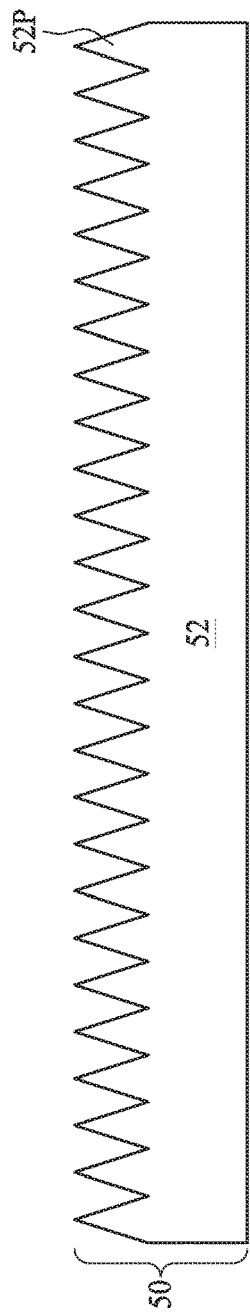
FIG. 5A is a schematic diagram of an anti-reflection layer in accordance with some embodiments of the present disclosure.

FIG. 5A is a schematic diagram of an anti-reflection layer in accordance with some embodiments of the present disclosure. As shown in FIG. 5 and FIG. 5A, the anti-reflection layer 50 may include a structural layer 52. In some embodiments, the structural layer 52 includes a plurality of protrusion structures 52P opposite to the display device 10. By way of example, the protrusion structures 52P may include moth-eye structures protruding out from the structural layer 52, and recessed structures such as valleys may be formed between adjacent moth-eye structures. In some embodiments, the protrusion structures 52P and the recessed structures are connected to one another, and no flat surface is formed between the protrusion structures 52P and the recessed structures. In some embodiments, the refractive index of the structural layer 52 is different from the refractive index of a medium interfacing the structural layer 52. In some embodiments, the refractive index of the structural layer 52 is greater than the refractive index of the medium. By way of example, the medium may include a gaseous medium such as air having a refractive index of about 1, and the structural layer 52 may be formed from a transparent material such as organic or inorganic material having a refractive index of about 1.5, but is not limited thereto.

Figure 5B:
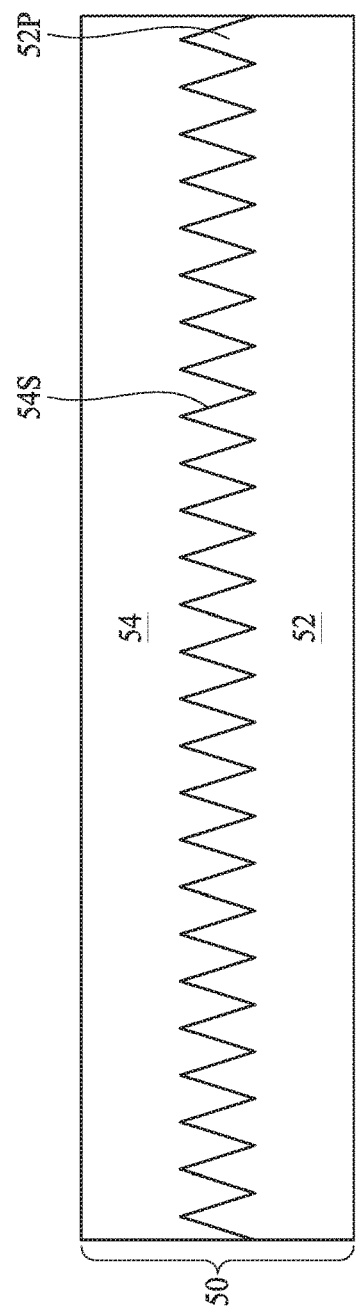
FIG. 5B is a schematic diagram of an anti-reflection layer in accordance with some embodiments of the present disclosure.

FIG. 5B is a schematic diagram of an anti-reflection layer in accordance with some embodiments of the present disclosure. As shown in FIG. 5B, the anti-reflection layer 50 may further include an optical layer 54 disposed over the structural layer 52. In some embodiments, the optical layer 54 is in contact with the structural layer 52, and a surface 54S of the optical layer 54 is engaged with the protrusion structures 52P of the structural layer 52. In some embodiments, the structural layer 52 and the optical layer 54 are formed from transparent materials such as organic or inorganic materials having different refractive indices. In some embodiments, the refractive index of the optical layer 54 is smaller than the refractive index of the structural layer 52. By way of example, the refractive index of the optical layer 54 is about 1, and the refractive index of the structural layer 52 is about 1.5, but is not limited thereto.

In some embodiments, the anti-reflection layer 50 is integrally formed over the display device 10. The anti-reflection layer 50 includes protrusion structures 52P and recess structures having different refractive indices such that the effective refractive index of the anti-reflection layer 50 varies in a depth direction. In some embodiments, the effective refractive index of the anti-reflection layer 50 varies continuously in the depth direction. In some embodiments, the effective refractive index of the anti-reflection layer 50 varies discretely in the depth direction. Accordingly, reflection of incident ambient light can be further reduced. The installation of the anti-reflection layer 50 and the anti-reflection structure 30 can further enhance inhibition of reflection of incident ambient light.

Figure 6:
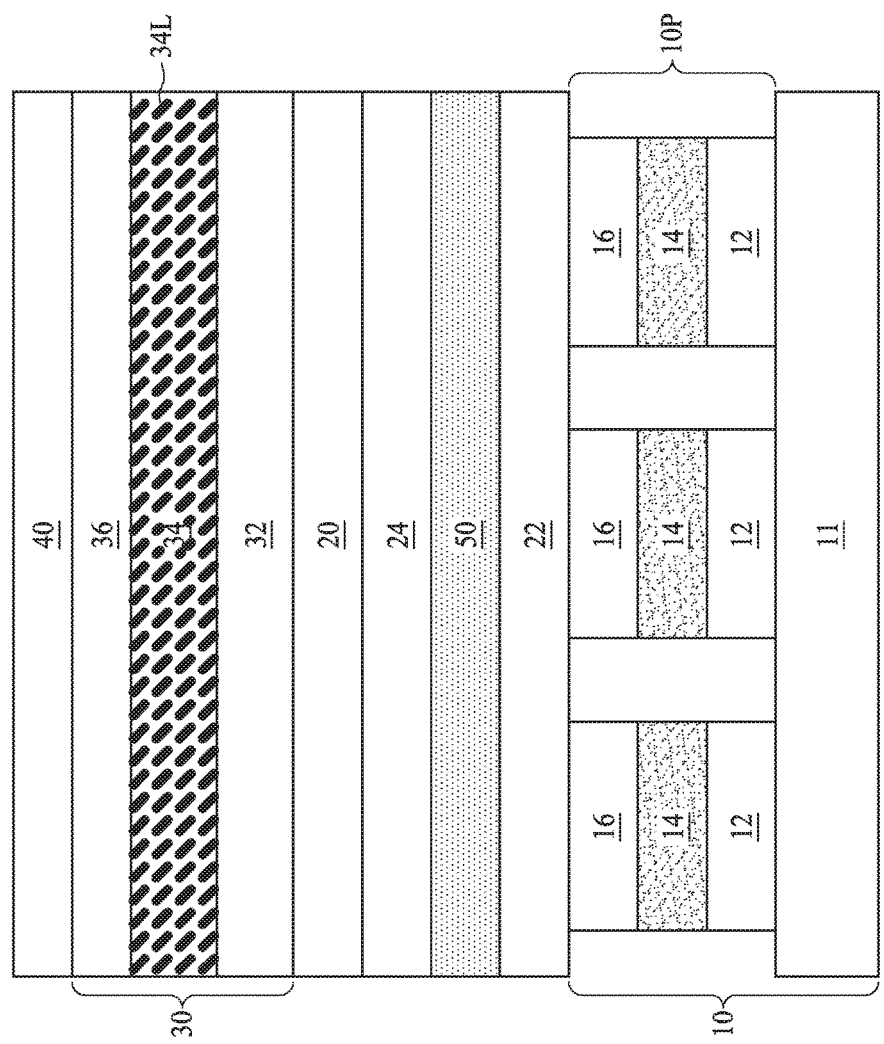
FIG. 6 is a schematic diagram of a display panel in accordance with some embodiments of the present disclosure.

FIG. 6 is a schematic diagram of a display panel in accordance with some embodiments of the present disclosure. As shown in FIG. 6, in contrast to the display panel 4 of FIG. 5, the anti-reflection layer 50 of the display panel 5 may be disposed between the optical absorbing layer 20 and the display device 10. For example, the anti-reflection layer 50 may be disposed between the TFE 22 and the touch input device 24. The installation of the anti-reflection layer 50 and the anti-reflection structure 30 can further enhance inhibition of reflection of incident ambient light.

Figure 7:
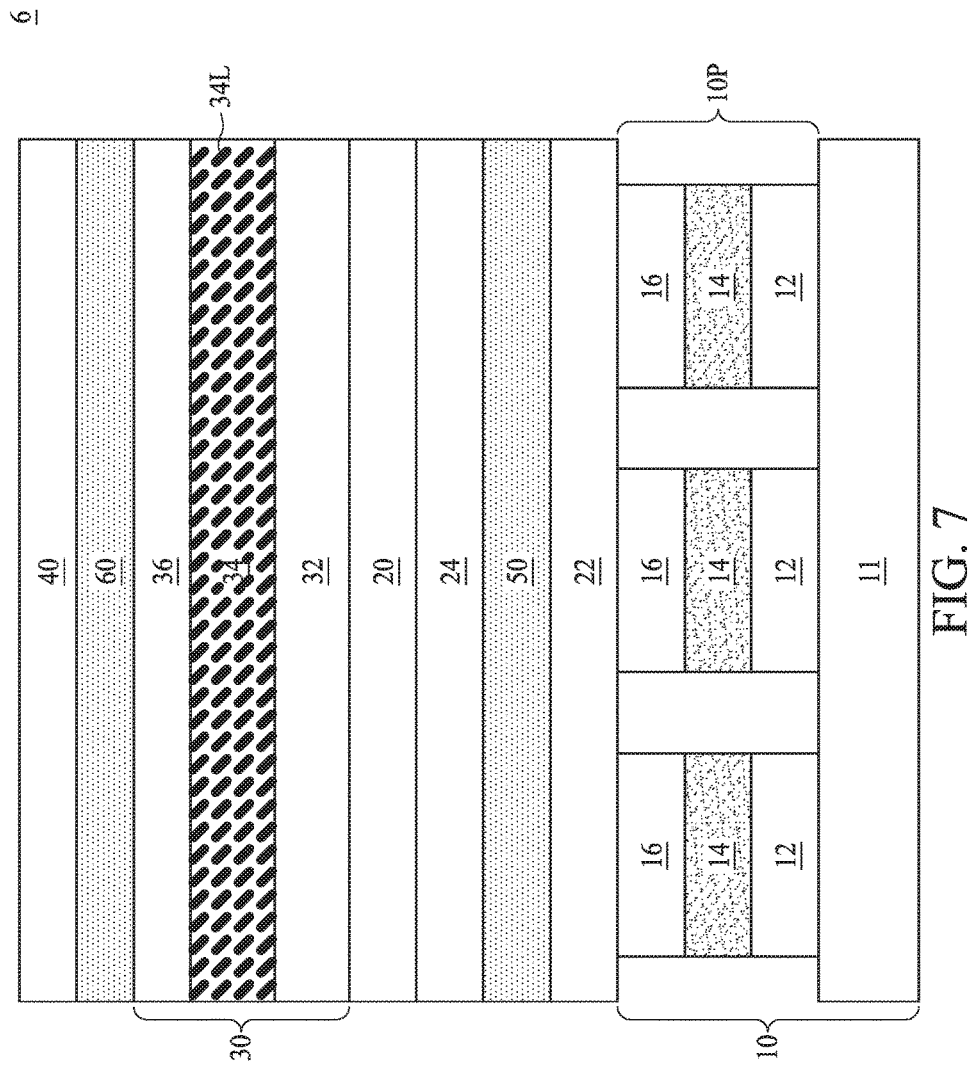
FIG. 7 is a schematic diagram of a display panel in accordance with some embodiments of the present disclosure.

FIG. 7 is a schematic diagram of a display panel in accordance with some embodiments of the present disclosure. As shown in FIG. 7, in contrast to the display panel 5 of FIG. 6, the display panel 6 may further include two anti-reflection layers 50 and 60. In some embodiments, the anti-reflection layer 50 may be disposed between the TFE 22 and the touch input device 24, and another anti-reflection layer 60 may be disposed between the linear polarizer 36 and the cover layer 40. In some embodiments, the anti-reflection layer 50 disposed proximal to the display device 10 may include detailed structure as illustrated in FIG. 5A or FIG. 5B. In some embodiments, the detailed structure of the anti-reflection layer 60 may be illustrated in FIG. 7A or FIG. 7B.

FIG. 7A is a schematic diagram of an anti-reflection layer in accordance with some embodiments of the present disclosure. As shown in FIG. 7 and FIG. 7A, the anti-reflection layer 60 may include a structural layer 62. In some embodiments, the structural layer 62 includes a plurality of protrusion structures 62P facing the display device 10. By way of example, the protrusion structures 62P may include moth-eye structures protruding out from the structural layer 62, and recessed structures such as valleys may be formed between adjacent moth-eye structures. In some embodiments, the protrusion structures 62P and the recessed structures are connected to one another, and no flat surface is formed between the protrusion structures 62P and the recessed structures. In some embodiments, the refractive index of the structural layer 62 is different from the refractive index of the medium interfacing the structural layer 62. In some embodiments, the refractive index of the structural layer 62 is greater than the refractive index of a medium. By way of example, the medium may include a gaseous medium such as air having a refractive index of about 1, and the structural layer 62 may be formed from a transparent material such as organic or inorganic material having a refractive index of about 1.5, but not limited thereto. In some embodiments, the protrusion structures 62P of the anti-reflection layer 60 and the protrusion structures 52P of the anti-reflection layer 50 face each other. For example, the protrusion structures 62P protrude toward the anti-reflection layer 50, and the protrusion structures 52P protrude toward the anti-reflection layer 60.

Figure 7B:
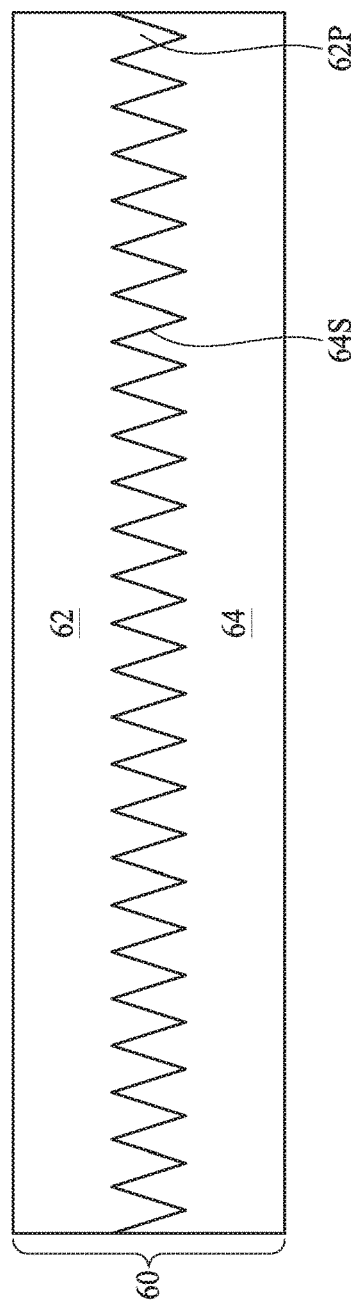
FIG. 7B is a schematic diagram of an anti-reflection layer in accordance with some embodiments of the present disclosure.

FIG. 7B is a schematic diagram of an anti-reflection layer in accordance with some embodiments of the present disclosure. As shown in FIG. 7B, the anti-reflection layer 60 may further include an optical layer 64 disposed over the structural layer 62. In some embodiments, the optical layer 64 is in contact with the structural layer 62, and a surface 64S of the optical layer 64 is engaged with the protrusion structures 62P of the structural layer 62. In some embodiments, the structural layer 62 and the optical layer 64 are formed from transparent materials such as organic or inorganic materials having different refractive indices. In some embodiments, the refractive index of the optical layer 64 is smaller than the refractive index of the structural layer 62. By way of example, the refractive index of the optical layer 64 is about 1, and the refractive index of the structural layer 62 is about 1.5, but not limited thereto. In some embodiments, the protrusion structures 62P and the protrusion structures 52P face each other. For example, the protrusion structures 62P protrude toward the anti-reflection layer 50, and the protrusion structures 52P protrude toward the anti-reflection layer 60.

In some embodiments, the anti-reflection layer 60 is integrally formed over the display device 10. The anti-reflection layer 60 includes protrusion structures 62P and recess structures having different refractive indices such that the effective refractive index of the anti-reflection layer 60 varies in a depth direction. In some embodiments, the effective refractive index of the anti-reflection layer 60 varies continuously in the depth direction. In some embodiments, the effective refractive index of the anti-reflection layer 60 varies discretely in the depth direction. Accordingly, reflection of incident ambient light can be further reduced. The installation of the anti-reflection layers 50, 60 and the anti-reflection structure 30 can further enhance inhibition of reflection of incident ambient light.

Figure 8A:
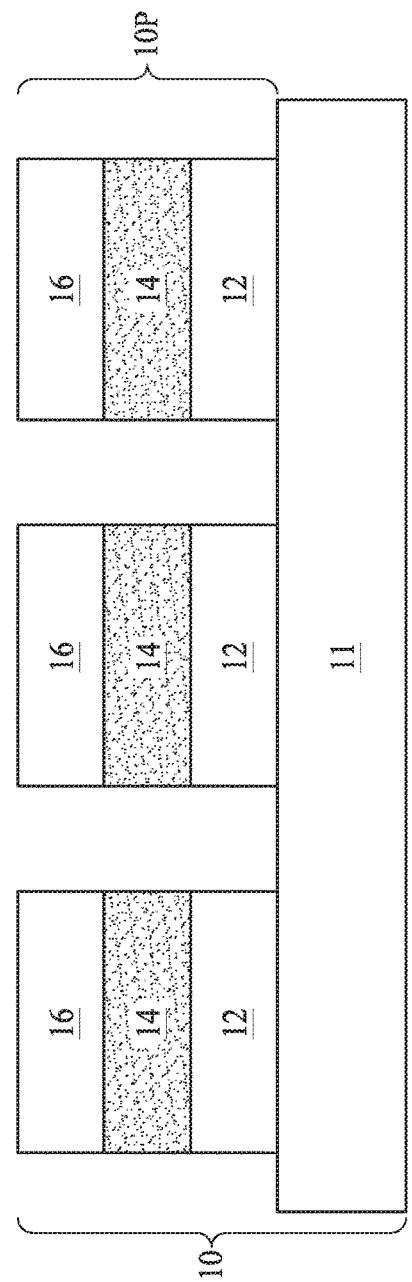
FIG. 8A, FIG. 8B, FIG. 8C, FIG. 8D and FIG. 8E are schematic diagrams illustrating a method for forming a display panel in accordance with some embodiments of the present disclosure.

FIG. 8A, FIG. 8B, FIG. 8C, FIG. 8D and FIG. 8E are schematic diagrams illustrating a method for forming a display panel in accordance with some embodiments of the present disclosure. As shown in FIG. 8A, a display device 10 such as an organic light-emitting diode (OLED) device is formed. In some embodiments, the display device 10 includes a plurality of pixels 10P, and each of the pixels 10P includes an organic light-emitting layer 14 formed over a substrate 11, and the organic light-emitting layer 14 has a glass transition temperature. In some embodiments, each of the pixels 10P may further include an anode 12 and a cathode 16 for driving the organic light-emitting layer 14.

Figure 8B:
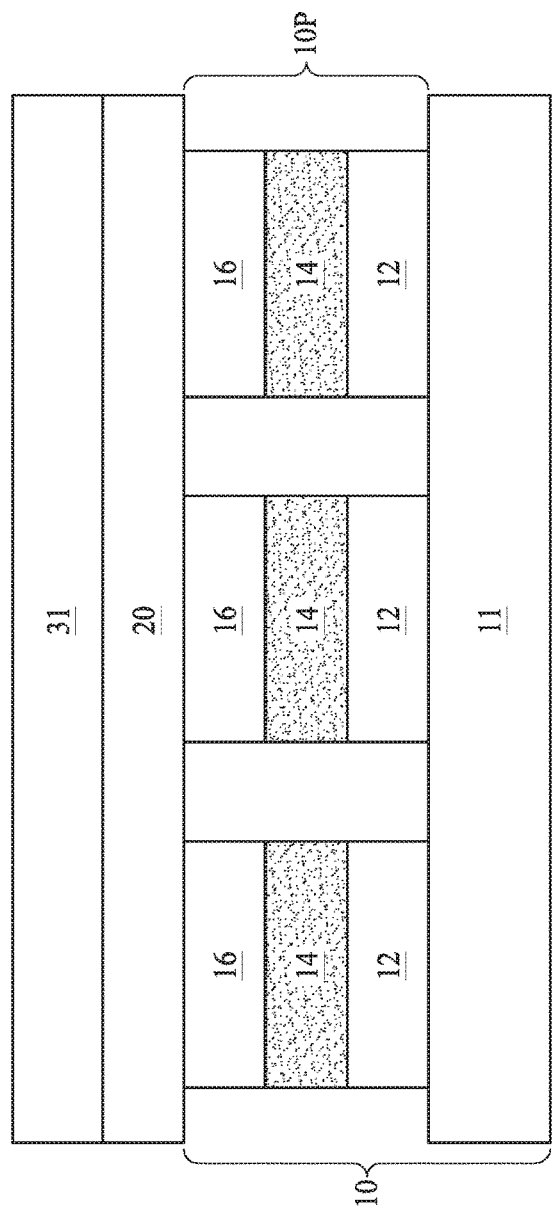

As shown in FIG. 8B, a photo-sensitive material 31 may be formed over the display device 10. In some embodiments, the photo-sensitive material 31 may be integrally formed over the display device 10 by coating, dispensing or other suitable methods. In some embodiments, the photo-sensitive material 31 may be formed from a photo-sensitive material such as a polyimide-based material, but not limited thereto. In some embodiments, an optical absorbing layer 20 may be optionally formed over the display device 10 prior to formation of the photo-sensitive material 31 over the display device 10. In some embodiments, a thermal treatment is performed to heat the photo-sensitive material 31 at a curing temperature to solidify the photo-sensitive material 31. The curing temperature of the photo-sensitive material 31 is lower than the glass transition temperature of the organic light-emitting layer 14. In some embodiments, the curing temperature of the photo-sensitive material 31 is substantially lower than 110° C., such as between about 50° C. and about 80° C., but not limited thereto.

Figure 8C:
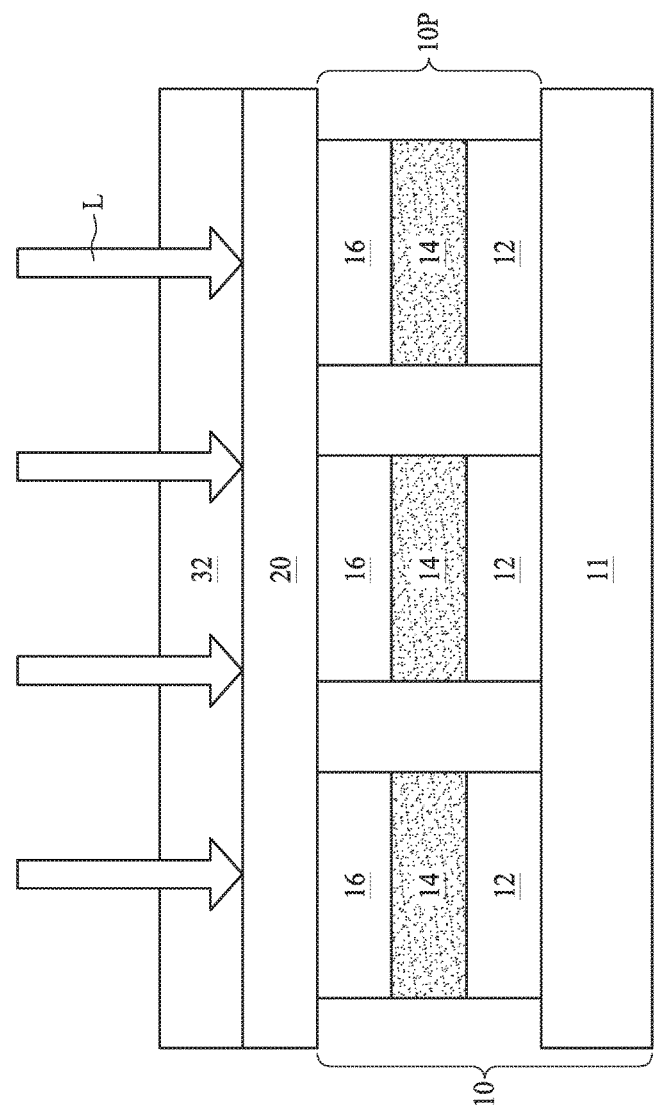

As shown in FIG. 8C, the photo-sensitive material 31 is irradiated with a light L to form a photo-sensitive alignment layer 32. In some embodiments, the light L for curing the photo-sensitive material 31 is a linear polarizing invisible light such as a linear polarizing UV light having a wavelength range substantially between 200 nm and 400 nm, but not limited thereto. In some embodiments, the material of the photo-sensitive material 31 may be decomposed after irradiation of the light L. In some embodiments, the optical absorbing layer 20 is configured to absorb the light L and prevent the display device 10, particularly the organic light-emitting layers 14, from being damaged by exposure to the light L. The optical absorbing layer 20 allows the light emitted by the display device 10 to pass such that display images of the display device 10 are not affected. In some embodiments, the thermal treatment may be performed prior to and/or subsequent to the irradiation of the photo-sensitive material 31.

Figure 8D:
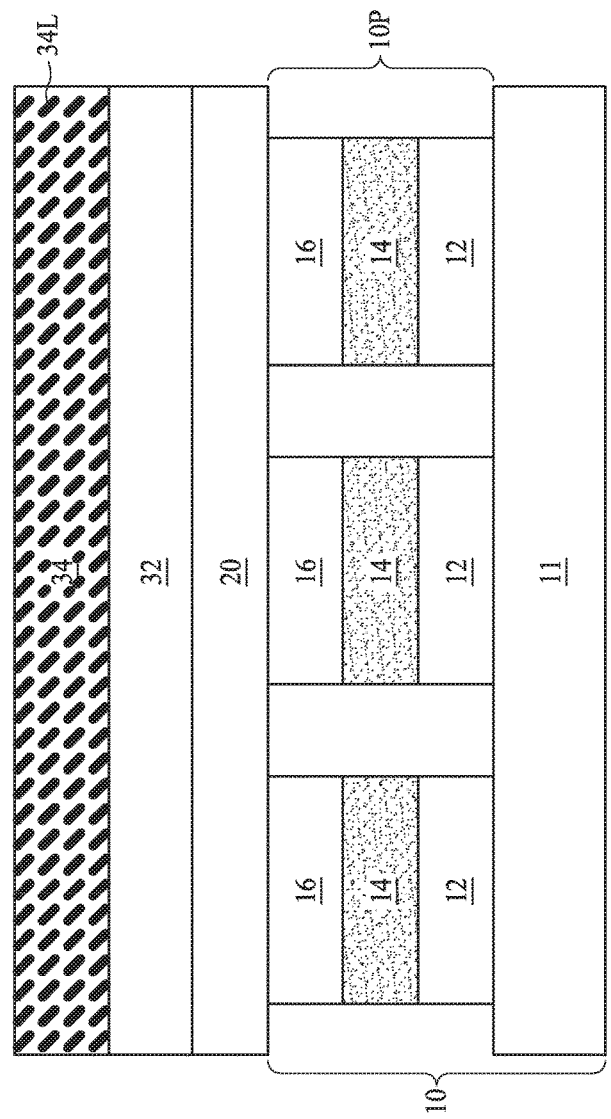

As shown in FIG. 8D, a plurality of liquid crystal molecules 34L may be integrally formed over the photo-sensitive alignment layer 32 by coating, dispensing or other suitable methods. The liquid crystal molecules 34L may be bonded to the decomposed material of the photo-sensitive material 31 such as by Van der waals force, and aligned by the photo-sensitive alignment layer 32 to form a liquid crystal circular polarizer 34 with phase retardation effect. In some embodiments, the liquid crystal circular polarizer 34 has ¼ wavelength retardation effect, and is configured as a circular polarizer. In contrast to a mechanical alignment such as rubbing process which may cause damage to the display device 10 or underlying layers, the display device 10 or underlying layers is less likely to be damaged during the optical alignment, and thus the reliability of the display panel can be increased.

Figure 8E:
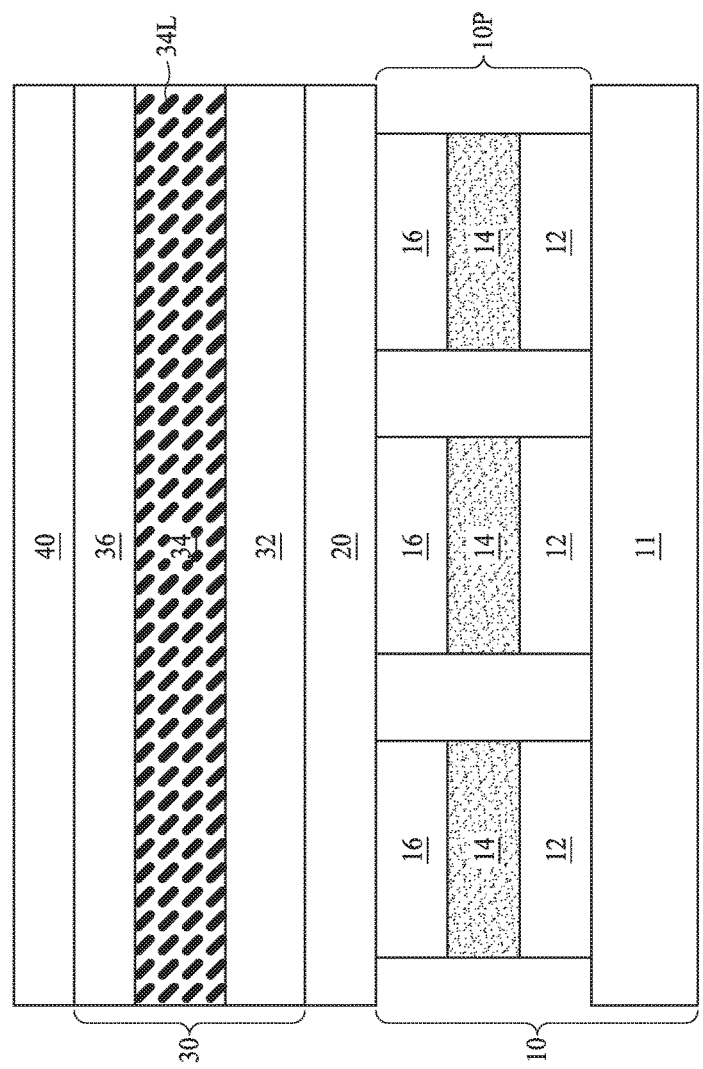

As shown in FIG. 8E, a linear polarizer 36 may be integrally formed over the liquid crystal circular polarizer 34 by coating, dispending, depositing or other suitable methods. The photo-sensitive alignment layer 32, the liquid crystal circular polarizer 34 and the linear polarizer 36 form an anti-reflection structure 30 able to inhibit reflection of incident ambient light. In some embodiments, a cover layer 40 is formed over the linear polarizer 36 to protect the linear polarizer 36.

In some embodiments of the present disclosure, a display panel such as an OLED display panel is equipped with an integrally-formed anti-reflection structure. The integrally-formed anti-reflection structure can be directly formed on the display surface of the display panel without damaging the display device such as OLED device and without requiring additional adhesive layers, and thus can save manufacturing costs and minimize the overall thickness of the display panel. The integrally-formed anti-reflection structure can inhibit reflection of incident light from the environment, and thus can increase visibility and contrast ratio in outdoor use. The anti-reflection structure and other functional layers such as the TFE, the optical absorbing layer, the touch input device, the anti-reflection layer and the cover layer are formed from extendable material, and may be formed directly over the display device without requiring additional adhesive layers. Accordingly, adhesion between any two adjacent layers of the above layers is enhanced. The enhanced adhesion reduces the risk of delamination of the display panel, especially when the display panel is operated in a bent or folded mode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A display panel, comprising:
   a display device comprising a plurality of pixels;
   an optical absorbing layer over the display device;
   an anti-reflection structure over the pixels of the display device, wherein the optical absorbing layer is between the anti-reflection structure and the display device, and the anti-reflection structure comprises:
      a photo-sensitive alignment layer over the optical absorbing layer, wherein the photo-sensitive alignment layer is sensitive to and curable by a curing light within a wavelength range, and the optical absorbing layer is configured to absorb the curing light passing through the photo-sensitive alignment layer;

a liquid crystal circular polarizer over the photo-sensitive alignment layer, wherein the liquid crystal circular polarizer comprises a plurality of liquid crystal molecules aligned by the photo-sensitive alignment layer; and a linear polarizer over the liquid crystal circular polarizer; and a cover layer over the anti-reflection structure.

2. The display panel of claim 1, wherein the curing light comprises an invisible light.

3. The display panel of claim 2, wherein the optical absorbing layer comprises a UV light absorbing layer, and the wavelength range is substantially between 200 nm and 400 nm.

4. The display panel of claim 1, wherein the liquid crystal circular polarizer is configured as a ¼ wavelength retardation layer.

5. The display panel of claim 1, wherein the display device comprises an organic light-emitting diode (OLED) device, and each of the pixels comprises an anode, an organic light-emitting layer over the anode, and a cathode over the organic light-emitting layer.

6. The display panel of claim 5, wherein a curing temperature of the photo-sensitive alignment layer is lower than a glass transition temperature of the organic-light emitting layer.

7. The display panel of claim 1, further comprising a thin film encapsulation between the display device and the optical absorbing layer.

8. The display panel of claim 1, further comprising a touch input device between the display device and the cover layer.

9. The display panel of claim 1, further comprising at least one anti-reflection layer between the display device and the cover layer.

10. The display panel of claim 9, wherein the anti-reflection layer is between the linear polarizer and the cover layer.

11. The display panel of claim 9, wherein the anti-reflection layer is between the optical absorbing layer and the display device.

12. The display panel of claim 9, wherein the anti-reflection layer comprises a structural layer including a plurality of protrusion structures opposite to the linear polarizer.

13. The display panel of claim 12, wherein the anti-reflection layer further comprises an optical layer in contact with the structural layer, and a surface of the optical layer is engaged with the protrusion structures.

14. The display panel of claim 13, wherein a refractive index of the optical layer is smaller than a refractive index of the structural layer.

15. A display panel, comprising:
a display device comprising a plurality of pixels;
an optical absorbing layer over the display device and configured to absorb a curing light within a wavelength range;
an anti-reflection structure over the pixels of the display device, wherein the anti-reflection structure comprises:
a photo-sensitive alignment layer over the optical absorbing layer, wherein the photo-sensitive alignment layer is sensitive to and curable by the curing light within the wavelength range;
a liquid crystal circular polarizer over the photo-sensitive alignment layer, wherein the liquid crystal circular polarizer comprises a plurality of liquid crystal molecules aligned by the photo-sensitive alignment layer; and
a linear polarizer over the liquid crystal circular polarizer;
a cover layer over the anti-reflection structure; and
at least one anti-reflection layer between the display device and the cover layer, wherein the anti-reflection layer comprises a structural layer including a plurality of protrusion structures opposite to the linear polarizer and an optical layer in contact with the structural layer, a surface of the optical layer is engaged with the protrusion structures, and a refractive index of the optical layer is smaller than a refractive index of the structural layer.

* * * * *